(12) United States Patent
Ooki

(10) Patent No.: US 9,294,691 B2
(45) Date of Patent: Mar. 22, 2016

(54) IMAGING DEVICE, IMAGING APPARATUS, MANUFACTURING APPARATUS AND MANUFACTURING METHOD

(75) Inventor: Susumu Ooki, Kumamoto (JP)

(73) Assignee: SONY CORPORATION, Tokyo (JP)

( * ) Notice: Subject to any disclaimer, the term of this patent is extended or adjusted under 35 U.S.C. 154(b) by 691 days.

(21) Appl. No.: 13/597,328

(22) Filed: Aug. 29, 2012

(65) Prior Publication Data

US 2013/0057699 A1 Mar. 7, 2013

(30) Foreign Application Priority Data

Sep. 6, 2011 (JP) ................. 2011-193823

(51) Int. Cl.
*H04N 5/33* (2006.01)
*H01L 27/146* (2006.01)
*H04N 5/335* (2011.01)

(52) U.S. Cl.
CPC ............ *H04N 5/335* (2013.01); *H01L 27/1464* (2013.01); *H01L 27/14621* (2013.01); *H01L 27/14629* (2013.01); *H01L 27/14636* (2013.01); *H01L 27/14645* (2013.01); *H01L 27/14649* (2013.01); *Y10T 29/49002* (2015.01)

(58) Field of Classification Search
CPC ...... H04N 5/33; H04N 5/335; H04L 27/1465; H04L 27/14652; H04L 27/14634; H04L 27/14636; H04L 27/1464
USPC ........................................................ 348/308
See application file for complete search history.

(56) References Cited

U.S. PATENT DOCUMENTS

| | | | | |
|---|---|---|---|---|
| 6,107,618 A | * | 8/2000 | Fossum et al. | 250/208.1 |
| 2006/0008937 A1 | * | 1/2006 | Blanchard et al. | 438/57 |
| 2007/0012970 A1 | * | 1/2007 | Mouli | 257/292 |
| 2007/0215921 A1 | * | 9/2007 | Hsu et al. | 257/290 |
| 2010/0276736 A1 | * | 11/2010 | Bocko et al. | 257/291 |

FOREIGN PATENT DOCUMENTS

| | | |
|---|---|---|
| JP | 2004-221506 | 8/2004 |
| JP | 2008-071972 | 3/2008 |
| JP | 2008-227250 | 9/2008 |
| JP | 2010-135700 | 6/2010 |
| JP | 2011-199798 | 10/2011 |
| JP | 2012-018951 | 1/2012 |
| JP | 2012-084814 | 4/2012 |
| JP | 2012-094720 | 5/2012 |
| WO | WO 2007/086352 | 8/2007 |

OTHER PUBLICATIONS

International Search Report (with English translation) for International (PCT) Patent Application No. PCT/JP2013/069110 mailed Sep. 3, 2013, 7 pages.

* cited by examiner

*Primary Examiner* — Sinh Tran
*Assistant Examiner* — Mark Monk
(74) *Attorney, Agent, or Firm* — Sheridan Ross P.C.

(57) ABSTRACT

An imaging device includes: plural photoelectric conversion device layers in which photoelectric conversion devices performing photoelectric conversion of incident light are formed; and a wiring layer sandwiched by respective photoelectric conversion device layers, in which wirings for reading charges from the photoelectric conversion devices are formed.

18 Claims, 11 Drawing Sheets

IMAGING DEVICE, IMAGING APPARATUS, MANUFACTURING APPARATUS AND MANUFACTURING METHOD

FIELD

The present disclosure relates to an imaging device, an imaging apparatus, a manufacturing apparatus and a manufacturing method, particularly, the present disclosure relates to an imaging device, an imaging apparatus, a manufacturing apparatus and a manufacturing method capable of obtaining more various types of images more easily.

BACKGROUND

As infrared light has a long penetration length to silicon (Si), it is necessary to elongate an optical path length in silicon when forming a high-sensitive sensor using near-infrared light. It is also necessary to form a potential for storing electrons obtained by photoelectrical conversion so as to reach a deeper position as photoelectric conversion occurs in a deeper position from a silicon surface on which light is incident.

As ion implantation with ultra-high energy is necessary for forming the potential in the deep position, there is a danger of increasing costs for development or manufacturing in related art. It is also necessary to develop resist correspond to the potential, which may increase difficulty level in development.

Accordingly, a method of forming photodiodes capable of sufficiently storing electrons photoelectrically converted by infrared light by performing ion implantation from the front-surface side and the back-surface side of a silicon substrate surface (a method in which ion implantation with ultra-high energy is not necessary) has been devised (for example, refer to JP-A-2010-192483 (Patent Document 1)).

In the method, first, photodiodes are formed on the surface of a silicon substrate in approximately the same depth as an image sensor corresponding to visible light by performing ion implantation from the front-surface side of the silicon substrate. After that, the silicon substrate is reversed and the back surface of the silicon substrate is polished. Then, ion implantation is performed from the back-surface side, thereby forming photodiodes on the back surface of the silicon substrate in approximately the same depth as the image sensor corresponding to visible light. A photoelectric conversion area having twice the depth at the maximum with respect to a depth direction is formed without performing ion implantation with ultra-high energy by applying the above manufacturing method.

The reversed silicon substrate is polished to have a necessary film thickness and ion is implanted, then, adhered to a support substrate for supporting the thickness of silicon after polishing. Then, an impurity which has been ion-implanted from the back-surface side of the silicon substrate is activated by high-temperature activation processing.

SUMMARY

However, in the method described in Patent Document 1, it is necessary to perform activation processing for activating the impurity which has been ion-implanted from the back-surface side of the silicon substrate so that the adhesion between the silicon substrate and the support substrate is not destroyed. Accordingly, it is necessary to prepare special equipment for performing processing such as laser annealing which can perform heat treatment for a short period of time and does not thermally affect an adhesion interface. Therefore, there is a danger of increasing manufacturing costs.

In view of the above, it is desirable to perform imaging of obtaining plural images by photoelectrically converting wavelength band components of incident light which are different to each other to thereby perform imaging of obtaining more various types of images more easily.

An embodiment of the present disclosure is directed to an imaging device including plural photoelectric conversion device layers in which photoelectric conversion devices performing photoelectric conversion of incident light are formed, and a wiring layer sandwiched by respective photoelectric conversion device layers, in which wirings for reading charges from the photoelectric conversion devices are formed.

The imaging device may be configured such that the photoelectric conversion devices perform photoelectric conversion of wavelength band components of incident light different from each other in respective photoelectric conversion device layers.

The imaging device may be configured such that the photoelectric conversion devices in the first layer counted from the light incident side perform photoelectric conversion of a wavelength band component of visible light and photoelectric conversion devices in the second layer counted from the light incident side perform photoelectric conversion of a wavelength band component of near-infrared light in the plural photoelectric conversion device layers.

The imaging device may be configured such that the photoelectric conversion devices in the first layer counted from the light incident side perform photoelectric conversion of a short-wavelength band component of visible light and photoelectric conversion devices in the second layer counted from the light incident side perform photoelectric conversion of a long-wavelength band component of visible light in the plural photoelectric conversion device layers.

The imaging device may be configured such that the thicknesses of the photoelectric conversion devices differ from each other in respective layers.

The imaging device may be configured such that at least one of the size, shape and intervals of the photoelectric conversion devices differs in respective layers.

The imaging device may be configured such that the photoelectric conversion devices in plural layers output charges accumulated by photoelectrically converting incident light at the same timing.

The imaging device may be configured such that the photoelectric conversion devices in plural layers output charges accumulated by photoelectrically converting incident light at different timings in respective layers.

The imaging device may be configured such that the photoelectric conversion devices in plural layers output a combined image formed by combining images in respective layers by outputting charges accumulated by photoelectrically converting incident light.

The imaging device may be configured such that charge accumulation time of photoelectric conversion devices during which charges are accumulated by photoelectrically converting incident light differs in respective layers.

The imaging device may be configured such that the wirings in the wiring layer are arranged so that optical paths of incident light transmitted from one side to the other side of the wiring layer are secured.

The imaging device may be configured such that waveguides made of a material with a higher refractive index of light than surrounding materials are formed in the wiring layer.

The imaging device may be configured such that the wirings in the wiring layer are arranged in accordance with an incident angle of the incident light.

The imaging device may be configured such that external terminals of plural wiring layers in which wirings for reading charges from photoelectric conversion devices in different layers are formed are connected to each other by a through via hole.

Another embodiment of the present disclosure is directed to an imaging device including plural imaging devices superimposed to each other, each having a photoelectric conversion device layer in which photoelectric conversion devices performing photoelectric conversion of incident light are formed, and a wiring layer in which wirings for reading charges from the photoelectric conversion devices are formed, in which circuits of respective imaging devices are connected to each other.

The imaging device may be configured such that plural back-illuminated imaging devices each wiring layer of which is formed on a side opposite to the light incident side of each photoelectric conversion device layer are superimposed.

The imaging device may be configured such that a back-illuminated imaging device in which the wiring layer is formed on the side opposite to the light incident side of the photoelectric conversion device layer and a front-illuminated imaging device in which the wiring layer is formed on the light incident side of the photoelectric conversion device layer are superimposed.

Still another embodiment of the present disclosure is directed to an imaging apparatus including an imaging device having plural photoelectric conversion device layers in which photoelectric conversion devices performing photoelectric conversion of incident light are formed, and a wiring layer sandwiched by respective photoelectric conversion device layers, in which wirings for reading charges from the photoelectric conversion devices are formed, which images a subject, and a control unit controlling drive of the imaging device to perform imaging for obtaining a subject image.

Yet another embodiment of the present disclosure is directed to a manufacturing apparatus including imaging device manufacturing units manufacturing plural imaging devices each having a photoelectric conversion device layer in which photoelectric conversion devices performing photoelectric conversion of incident light are formed, and a wiring layer in which wirings for reading charges from the photoelectric conversion devices are formed, and an assembly unit superimposing the plural imaging devices manufactured by the imaging device manufacturing units and connecting circuits of respective imaging devices to each other.

Still yet another embodiment of the present disclosure is directed to a manufacturing method of a manufacturing apparatus, including manufacturing plural imaging devices each having a photoelectric conversion device layer in which photoelectric conversion devices performing photoelectric conversion of incident light are formed, and a wiring layer in which wirings for reading charges from the photoelectric conversion devices are formed by imaging device manufacturing units, and superimposing the manufactured plural imaging devices and connecting circuits of respective imaging devices to each other by an assembly unit.

According to one embodiment of the present disclosure, the imaging device includes plural photoelectric conversion device layers in which photoelectric conversion devices performing photoelectric conversion of incident light are formed, and the wiring layer sandwiched by respective photoelectric conversion device layers, in which wirings for reading charges from the photoelectric conversion devices are formed.

According to one embodiment of the present disclosure, the imaging device includes plural imaging devices superimposed to each other, each having the photoelectric conversion device layer in which photoelectric conversion devices performing photoelectric conversion of incident light are formed, and the wiring layer in which wirings for reading charges from the photoelectric conversion devices are formed, in which circuits of respective imaging devices are connected to each other.

According to one embodiment of the present disclosure, the imaging apparatus includes the imaging device having plural photoelectric conversion device layers in which photoelectric conversion devices performing photoelectric conversion of incident light are formed, and the wiring layer sandwiched by respective photoelectric conversion device layers, in which wirings for reading charges from the photoelectric conversion devices are formed, which images the subject, and the control unit controlling drive of the imaging device to perform imaging for obtaining the subject image.

According to one embodiment of the present disclosure, plural imaging devices are manufactured, each having the photoelectric conversion device layer in which photoelectric conversion devices performing photoelectric conversion of incident light are formed, and the wiring layer in which wirings for reading charges from the photoelectric conversion devices are formed, then, the manufactured plural imaging devices are superimposed and circuits of respective imaging devices are connected to each other.

According to the embodiments of the present disclosure, incident light can be photoelectrically converted. In particular, more various images can be obtained more easily.

DETAILED DESCRIPTION

Hereinafter, modes for carrying out the present disclosure (hereinafter referred to as embodiments) will be explained. The explanation will be made in the following orders.

1. First Embodiment (Imaging Device: Back-Illuminated Type+Front-Illuminated Type)
2. Second Embodiment (Manufacturing Apparatus and Method)
3. Third Embodiment (Application Example 1: Waveguide)
4. Fourth Embodiment (Application Example 2: Pupil Correction)
5. Fifth Embodiment (Application Example 3: PD Pitch Change)
6. Sixth Embodiment (Application Example 4: Visible Light+Visible Light)
7. Seventh Embodiment (Application Example 5: Back-Illuminated Type+Back-Illuminated Type)
8. Eighth Embodiment (Imaging Apparatus)

1. First Embodiment

Related-Art Imaging Device

Figure 1:
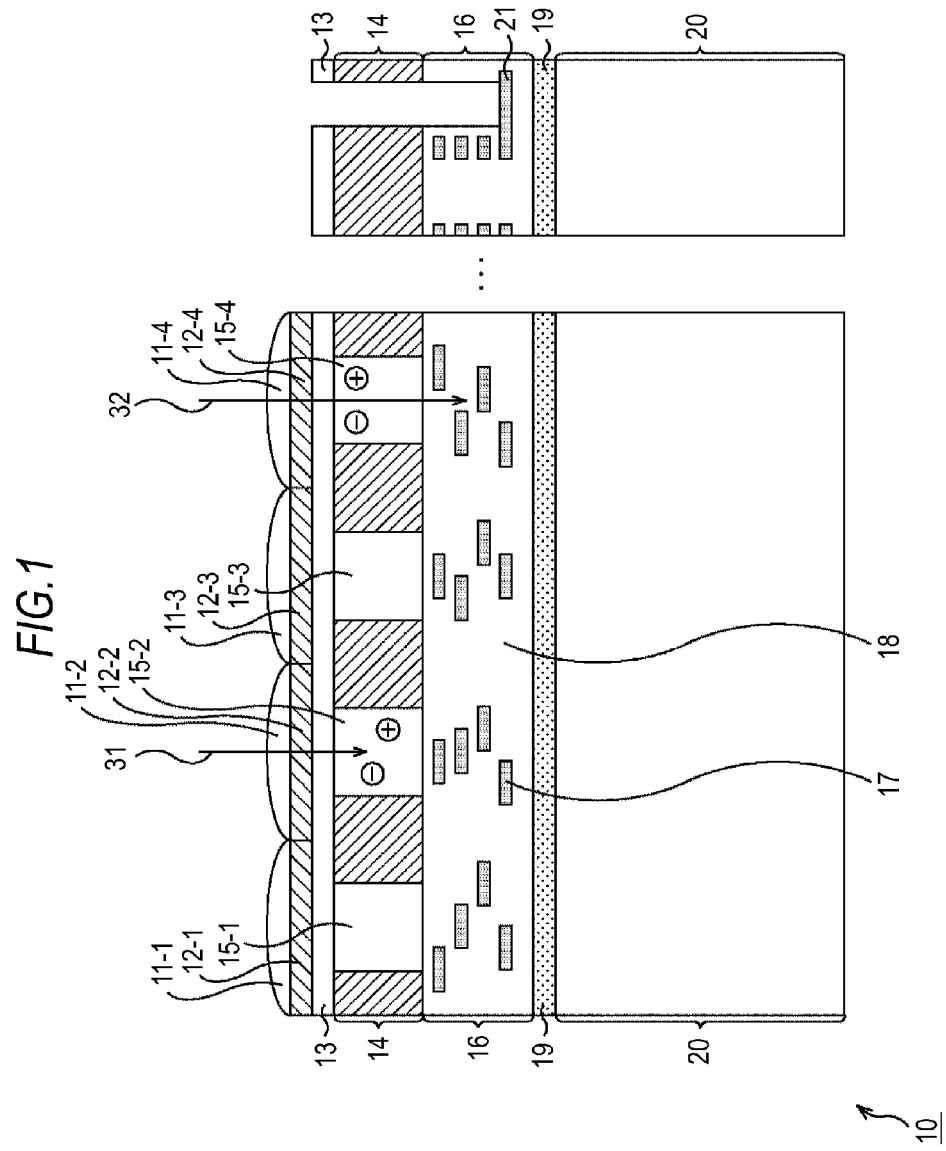
FIG. 1 is a view showing an example of a main structure of a related-art CMOS image sensor.

First, a structure example of a related-art imaging device will be explained. FIG. 1 is a view showing an example of a main structure of a related-art CMOS (Complementary Metal Oxide Semiconductor) image sensor. A CMOS image sensor 10 shown in FIG. 1 is a back-illuminated image sensor using a CMOS, which has an amplifier in each cell.

FIG. 1 shows an outline (an outline diagram in cross section) of a structure in a vertical direction (stacked direction) of the CMOS image sensor 10. As shown in FIG. 1, the CMOS image sensor 10 includes a condensing lens 11, a color filter 12 and a photodiode 15 in each pixel.

Four pixels are shown as an effective pixel area of the CMOS image sensor 10 in FIG. 1. As a structure of the four pixels, photodiodes 15-1 to 15-4 are formed on a semiconductor substrate 14. When it is not necessary to distinguish respective photodiodes from one another for explanation, each photodiode will be referred to as merely a photodiode 15.

A condensing lens 11-1 and a color filter 12-1 are provided with respect to the photodiode 15-1. A condensing lens 11-2 and a color filter 12-2 are provided with respect to the photodiode 15-2. A condensing lens 11-3 and a color filter 12-3 are provided with respect to the photodiode 15-3. A condensing lens 11-4 and a color filter 12-4 are provided with respect to the photodiode 15-4. When it is not necessary to distinguish respective condensing lenses from one another for explanation, each condensing lens will be referred to as merely a condensing lens 11. Similarly, when it is not necessary to distinguish respective color filters from one another for explanation, each color filter will be referred to as merely a color filter 12.

As shown in FIG. 1, an insulating film 13 is formed on a back surface of the semiconductor substrate 14 which is a light incident surface, and the color filter 12 and the condensing lens 11 are formed thereon.

On a front-surface side of the semiconductor substrate opposite to the light incident surface, a wiring layer 16, a passivation film 19 and a support substrate 20 are formed. Wirings 17 and a wiring interlayer film 18 are formed in the wiring layer 16.

A pad 21 for connecting to a circuit external to the CMOS image sensor 10 is formed in the wiring layer at an area other than the effective pixel area of the CMOS image sensor 10.

When a visible light 31 is incident on, for example, the condensing lens 11-2 in the CMOS image sensor 10 having the above structure, the visible light 31 transmits through the condensing lens 11-2, the color filter 12-2 and the insulating film 13 and is photoelectrically converted in the photodiode 15-2 efficiently.

On the other hand, as a near-infrared light 32 has a longer wavelength than the visible light 31, a penetration length to silicon (the semiconductor substrate 14) is longer than the visible light 31 and a potential distribution collecting electrons photoelectrically converted in a deeper position than the visible light 31 is necessary.

However, in the case of the back-illuminated type as the CMOS image sensor 10 shown in FIG. 1, it is generally necessary to form the semiconductor substrate 14 to have a thin film thickness of approximately 2 μm to 3 μm for suppressing occurrence of color mixture. Accordingly, it may be difficult that the photodiode 15-4 efficiently performs photoelectric conversion of the near-infrared light 32 incident through the condensing lens 11-4, the color filter 12-4 and the insulating film 13. That is, it is difficult to obtain sufficient sensitivity with respect to the near-infrared light 32 by the back-illuminated CMOS image sensor 10.

In the case of the method disclosed in Patent Document 1, ion-implantation is performed from both surfaces of the semiconductor substrate, and special equipment for performing processing such as laser annealing which can perform heat treatment for a short period of time is necessary. There is also a danger that color mixture occurs.

Though the silicon substrate can be formed to be thick in the case of the front-illuminated image sensor, it is necessary to perform ion implantation with ultra-high energy for forming the potential in a sufficiently deep position in which near-infrared light is photoelectrically converted efficiently.

Imaging Device of Embodiment of Present Disclosure

Consequently, an imaging device capable of obtaining plural images by performing photoelectric conversion of wavelength band components of incident light which are different to each other such as the above visible light and the near-infrared light will be explained.

Figure 2:
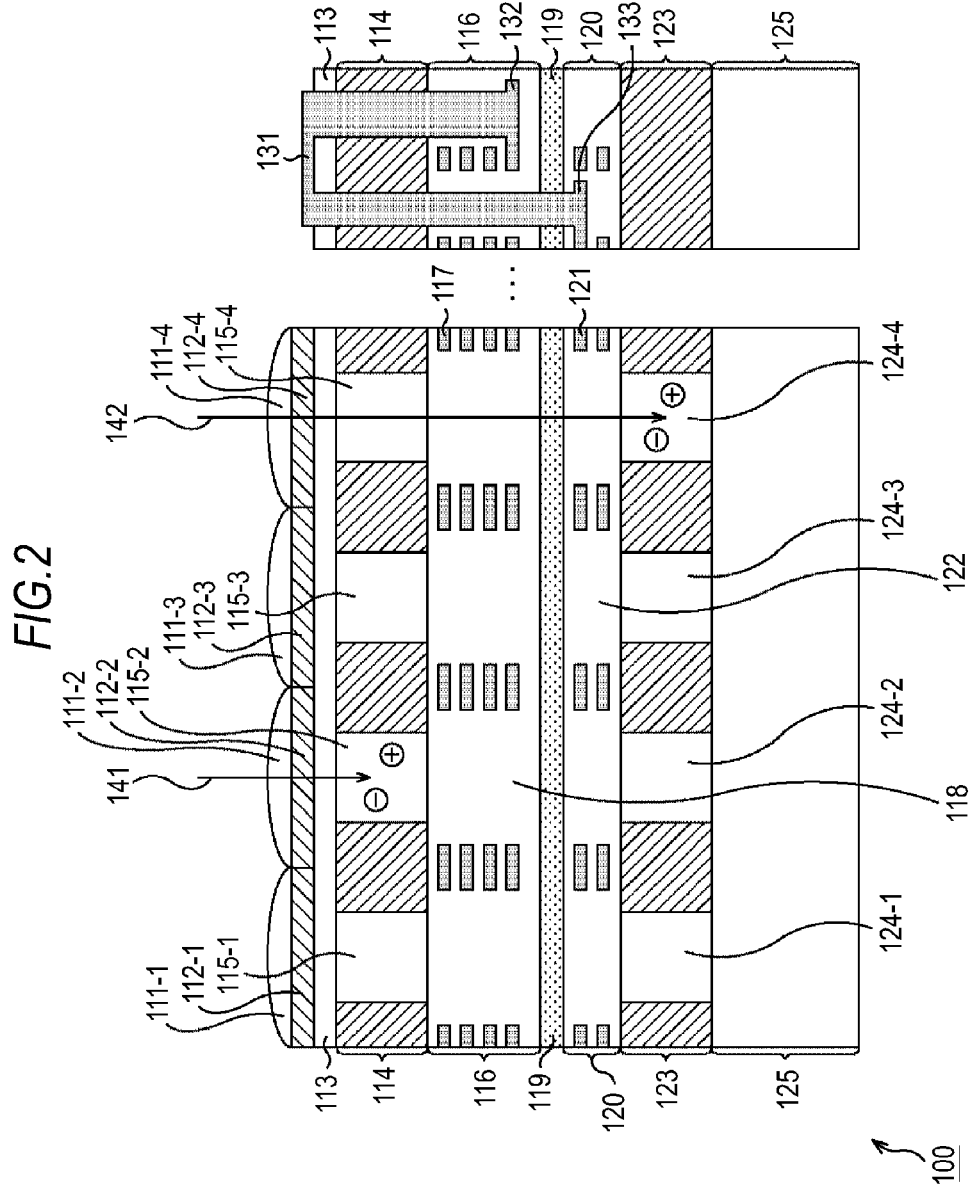
FIG. 2 is a view showing an example of a main structure of a CMOS image sensor according to an embodiment of the present disclosure.

FIG. 2 is a view showing a structure example of a CMOS image sensor to which the present disclosure is applied. A CMOS image sensor 100 shown in FIG. 2 is an image sensor using the CMOS similar to the CMOS image sensor 10 of FIG. 1.

FIG. 2 shows an outline (an outline diagram in cross section) of a structure in a vertical direction (stacked direction) of the CMOS image sensor 100. As shown in FIG. 2, light is incident on the CMOS image sensor 100 approximately from the top to the bottom in the drawing. The CMOS image sensor 100 has a multilayer structure with respect to a traveling direction of the incident light. That is, light incident on the CMOS image sensor 100 travels so as to be transmitted through respective layers.

Four pixels are shown as the effective pixel area of the CMOS image sensor 100 in FIG. 2. As a structure of the four pixels, photodiodes 115-1 to 115-4 are formed on a semiconductor substrate 114. As a structure of a pixel of the photodiode 115-1, a condensing lens 111-1 and a color filter 112-1 are formed. Also as a structure of a pixel of the photodiode 115-2, a condensing lens 111-2 and a color filter 112-2 are formed. Also as a structure of a pixel of the photodiode 115-3, a condensing lens 111-3 and a color filter 112-3 are formed. Furthermore, as a structure of a pixel of the photodiode 115-4, a condensing lens 111-4 and a color filter 112-4 are formed.

When it is not necessary to distinguish respective photodiodes from one another for explanation, each photodiode will be referred to as merely a photodiode 115. When it is not necessary to distinguish respective condensing lenses from one another for explanation, each condensing lens will be referred to as merely a condensing lens 111. Similarly, when it is not necessary to distinguish respective color filters from one another for explanation, each color filter will be referred to as merely a color filter 112.

Layers above a passivation film 119 in the CMOS image sensor 100 have the same structure as the CMOS image sensor 10 of FIG. 1. That is, the condensing lens 111, the color filter 112, the insulating film 113, the semiconductor substrate 114 (the photodiode 115), a wiring layer 116 (wirings 117 and a wiring interlayer film 118) and the passivation film 119 are formed from the top in the drawing.

The condensing lens 111 condenses light incident on an imaging surface to a corresponding photodiode 115, thereby improving quantum efficiency of the photodiode 115.

The color filter 112 transmits the incident light incident through the corresponding condensing lens 111, thereby allowing a component of a given wavelength (color) band of the incident light to be incident on the corresponding photodiode 115. The wavelength (color) band to be transmitted through each color filter 12 is optional, which may be visible light as well as infrared light or ultraviolet light. The color filters 112 may be filters transmitting the same wavelength (color) band or may be plural types of filters transmitting wavelength (color) bands different from one another such as, RGB or visible light and infrared light, and so on.

The color filters 112 includes plural types of filters, filters of respective wavelength (color) bands can be arranged in a given order such as Bayer arrangement. For example, it can be configured that the color filter 112-1 and the color filter 112-3 are filters transmitting red (R) and the color filter 112-2 and the color filter 112-4 are filters transmitting green (G(Gr)) in FIG. 2. Also, for example, it can be configured that the color filter 112-1 and the color filter 112-3 are filters transmitting green (G (Gb)) and the color filter 112-2 and the color filter 112-4 are filters transmitting blue (B).

The photodiode 115 formed on the semiconductor substrate 114 mainly performs photoelectric conversion of a wavelength component of visible light efficiently in the same manner as in the case of FIG. 1. That is, in the photodiode 115, a potential distribution for storing photoelectrically converted electrons is formed in a depth suitable for the wavelength band component of visible light included in the incident light. For example, a visible light 141 is transmitted through the condensing lens 111-2, the color filter 112-2 and the insulating film 113, and photoelectrically converted in the photodiode 115 efficiently.

A film thickness of the semiconductor substrate 114 is optional. For example, the semiconductor substrate 114 may be formed to have a thickness of 2 μm to 3 μm for suppressing occurrence of color mixture.

The wirings 117 in the wiring layer 116 are formed by using, for example, aluminum (Al) or copper (Cu). Though only one wiring is represented by the wiring 117 in FIG. 2, all gray rectangles in the wiring layer 116 of FIG. 2 are wirings 117. The wirings 117 have a four-layer structure in the wiring layer 116 of the example of FIG. 2, however, the number of layers of wirings is optional.

Incidentally, the CMOS image sensor 100 differs from the CMOS image sensor 10 of FIG. 1 in a point that the CMOS image sensor 100 further includes a wiring layer 120, a semiconductor substrate 123 and a support substrate 125 below the passivation film 119 in the drawing as shown in FIG. 2.

The wiring layer 120 is basically the same layer as the wiring layer 116. In the wiring layer 120, wirings 121 and a wiring interlayer film 122 are formed. Though only one wiring is represented by the wiring 121 in FIG. 2, all gray rectangles in the wiring layer 120 of FIG. 2 are wirings 121. The wirings 121 have a two-layer structure in the wiring layer 120 of the example of FIG. 2, however, the number of layers of wirings is optional.

In an area of the wiring layer 116 other than the effective pixel area of the CMOS image sensor 100, a pad 132 is formed as an external electrode of a circuit of the wiring layer 116. Also in an area of the wiring layer 120 other than the effective pixel area of the CMOS image sensor 100, a pad 133 is formed as an external electrode of a circuit of the wiring layer 120. The pad 132 and the pad 133 are connected by a TSV (Through-Silicon Via) 131 (a so-called through via). That is, the circuit of the wiring layer 116 and the circuit of the wiring layer 120 are connected. The number of the TSVs 131 is optional. Additionally, in areas of the wiring layer 116 and the wiring layer 120 other than the effective pixel area of the CMOS image sensor 100, pads (external electrodes) for connecting to circuits outside the CMOS image sensor 100 are formed, though not shown, in addition to the electrodes connected to each other by the TSV 131 such as the pad 132 or the pad 133.

The semiconductor substrate 123 is basically the same layer as the semiconductor substrate 114. In the semiconductor substrate 123, a photodiode 124-1 is formed as a structure of the pixel of the photodiode 115-1. Also in the semiconductor substrate 123, a photodiode 124-2 is formed as a structure of the pixel of the photodiode 115-2. Also in the semiconductor substrate 123, a photodiode 124-3 is formed as a structure of the pixel of the photodiode 115-3. Furthermore, in the semiconductor substrate 123, a photodiode 124-4 is formed as a structure of the pixel of the photodiode 115-4. When it is not necessary to distinguish respective photodiodes 124-1 to 124-4 from one another for explanation, each photodiode will be referred to as merely a photodiode 124.

Incident light transmitted through the photodiode 115 (incident light not converted photoelectrically in the photodiode 115) is incident on the semiconductor substrate 123 (photodiode 124) through the wiring layer 116, the passivation film 119 and the wiring layer 120. That is, the wirings 117 and the wirings 121 are arranged so that optical paths of incident light transmitted from one side to the other side are secured. For example, it is preferable that the wirings 117 and the wirings 121 are arranged only at positions below shaded portions in the semiconductor substrate 114 (portions where the photodiodes 115 are not formed) in the wiring layer 116 and the wiring layer 120 as shown in FIG. 2. Naturally, for example, it is also preferable that the wirings 117 and the wirings 121 are arranged at positions above shaded portions in the semiconductor substrate 123 (portions where the photodiodes 124 are not formed) in the wiring layer 116 and the wiring layer 120.

The photodiode 124 is provided at a position (depth) suitable for photoelectrically converting the wavelength band component of near-infrared light, which photoelectrically converts the wavelength band component of near-infrared light included in incident light not being photoelectrically converted in the photodiode 115 and is incident on the photodiode 124. For example, the near-infrared light 142 is transmitted through the condensing lens 111-4, the color filter 112-4, the insulating film 113, the photodiode 115-4, the wiring layer 116, the passivation film 119 and the wiring layer 120, then, photoelectrically converted in the photodiode 124-4 efficiently.

As described above, the CMOS image sensor 100 has the multilayer structure with respect to the traveling direction of the incident light, including two layers (the semiconductor substrate 114 and the semiconductor substrate 123) of photodiodes (photoelectric converters) sandwiching the wiring layers (the wiring layer 116 and the wiring layer 120).

As the above structure is applied, the CMOS image sensor 100 can perform photoelectric conversion of both wavelength band components of visible light and near-infrared light efficiently by the photodiode 115 and the photodiode 124.

Accordingly, as the CMOS image sensor 100 can detect both wavelength band components of visible light and near-infrared light with high sensitivity, high-quality images of visible light as well as a high-quality images of near-infrared light can be obtained. The CMOS image sensor 100 can obtain at least visible light images having approximately the same image quality as the CMOS image sensor 10 of FIG. 1, and can further obtain near-infrared images.

The CMOS image sensor 100 obtains a visible light image and a near-infrared image by using two steps of photodiodes (photodiodes 115 and the photodiodes 124). Therefore, the CMOS image sensor 100 can obtain the visible light image and the near-infrared image at the same time (can obtain images in the same timing). A case where the visible light image and the infrared image are preferably images in the same timing can be considered, such as a case where processing is performed by using both images, for example, a case where an image correction method is determined by using the infrared image and a visible light image is corrected by using the image correction method and so on. Naturally, a case where that both images are preferably images in different timings can also be considered. The CMOS image sensor 100 can obtain a visible light image and a near-infrared image at different timings to each other.

The CMOS image sensor 100 can obtain a high-quality infrared image by combining an image obtained by the photodiodes 115 with an image obtained by the photodiodes 124. That is, a near-infrared sensor in which an effective optical path length is elongated can be realized.

It is preferable that at least part of the wirings 117 and part of the wirings 121 correspond to wirings of a circuit for reading charges from at least one of the photodiodes 115 and the photodiodes 124. For example, it is also preferable that at least part of the wirings 117 in the wiring layer 116 corresponds to wirings for reading charges from the photodiodes 115 and at least part of the wirings 121 in the wiring layer 120 is wirings for reading charges from the photodiodes 124, and that these circuits are independent of each other.

In the above case, respective layers of the condensing lens 111 to the passivation film 119 configure a back-illuminated CMOS image sensor and respective layers of the wiring layer 120 to the support substrate 125 configure a front-illuminated CMOS image sensor. The back-illuminated CMOS image sensor and the front-illuminated CMOS image sensor are independent of each other. That is, two CMOS image sensors independent of each other are superimposed and connected in the CMOS image sensor 100 in this case.

The CMOS image sensor 100 in the above case can obtain high-quality images of visible light by performing photoelectric conversion of the wavelength band component of visible light in incident light by the back-illuminated CMOS image sensor. The CMOS image sensor 100 can also obtain high-quality images of near-infrared light by performing photoelectric conversion of the wavelength band component of near-infrared light in incident light by the front-illuminated CMOS image sensor.

Additionally, these CMOS image sensors superimposed as the structure of the CMOS image sensor 100 can be operated independently of each other. Accordingly, for example, the CMOS image sensor 100 can obtain the visible light image and the near-infrared image at the same time (can obtain images in the same timing) as well as can obtain the visible light image and the near-infrared image at different timings easily. The switching between the above modes can be easily performed.

For example, when the visible light image and the near-infrared image are obtained at the same time, output of charges accumulated by photoelectrically converting incident light by the photodiodes 115 and output of charges accumulated by photoelectrically converting incident light by the photodiodes 124 may be performed at the same timing to each other. When the visible light image and the near-infrared image are obtained at different timings, output of charges accumulated in the photodiode 115 and output of charges accumulated in the photodiode 124 may be performed at different timings.

Consequently, the CMOS image sensor 100 can obtain more various types of images more easily.

2. Second Embodiment

Manufacturing Apparatus

As described above, the CMOS image sensor 100 of FIG. 2 can be configured so that respective layers of the condensing lens 111 to the passivation film 119 form the back-illuminated CMOS image sensor and so that respective layers of the wiring layer 120 to the support substrate 125 form the front-illuminated CMOS image sensor.

Assume that these CMOS image sensors are independent from each other, the CMOS image sensor 100 can be configured by forming the back-illuminated CMOS image sensor and the front-illuminated CMOS image sensor respectively, superimposing the front-illuminated CMOS image sensor on the surface side of the formed back-illuminated CMOS image sensor and connecting the both image sensors by the TSV 131.

Figure 3:
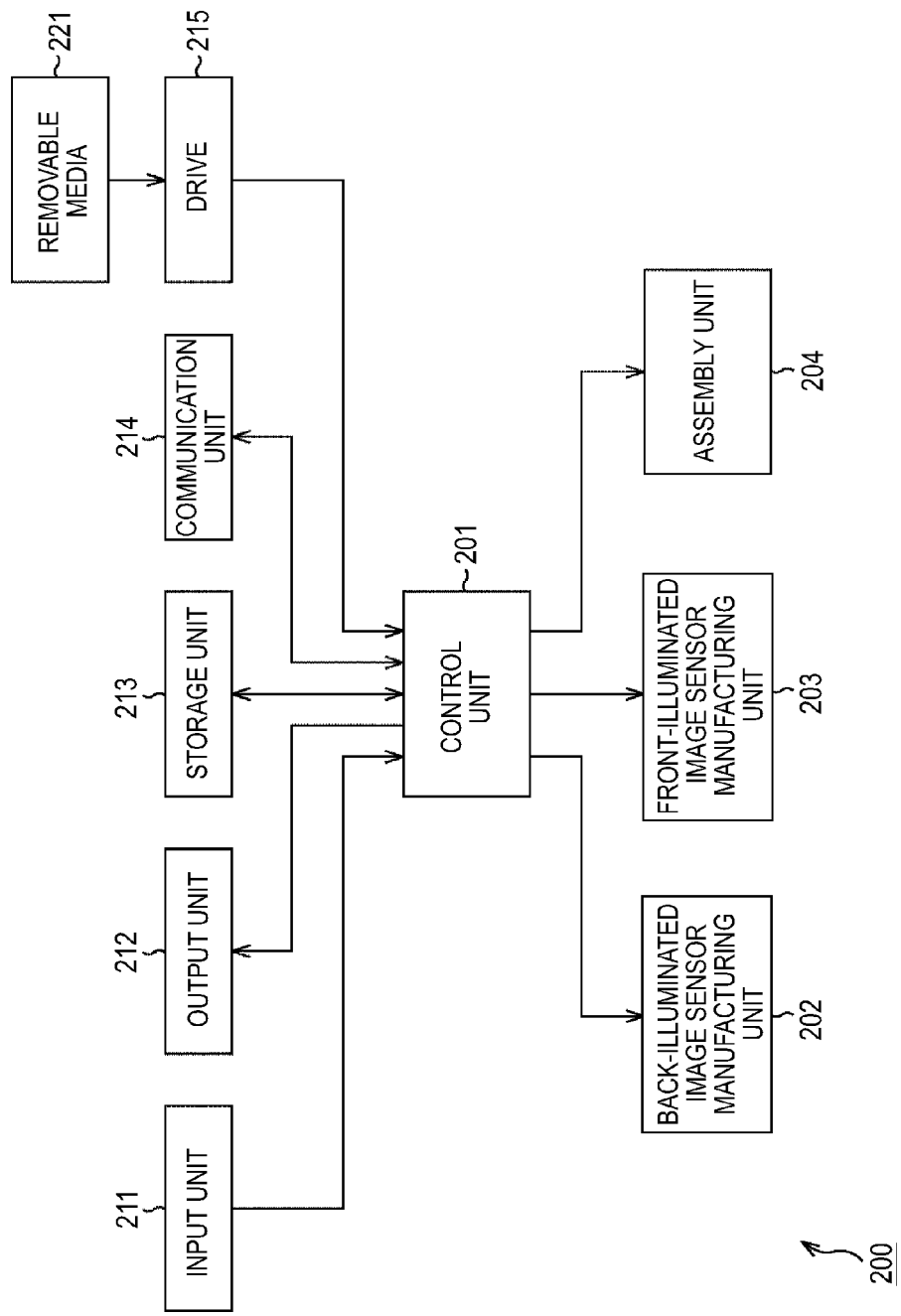
FIG. 3 is a block diagram showing an example of a main configuration of a manufacturing apparatus according to an embodiment of the present disclosure.

FIG. 3 is a block diagram showing an example of a main configuration of a manufacturing apparatus to which the present disclosure is applied. A manufacturing apparatus 200 shown in FIG. 3 is an apparatus for manufacturing the CMOS image sensor 100.

As shown in FIG. 3, the manufacturing apparatus 200 includes a control unit 201, a back-illuminated image sensor manufacturing unit 202, a front-illuminated image sensor manufacturing unit 203 and an assembly unit 204. The manufacturing apparatus 200 also includes an input unit 211, an output unit 212, a storage unit 213, a communication unit 214 and a drive 215.

The control unit 201 includes, for example, a CPU (Central Processing Unit), a ROM (Read Only Memory), a RAM (Random Access Memory) and so on, controlling other respective units and performing processing concerning manufacture of the CMOS image sensor 100. For example, the CPU of the control unit 201 executes various types of processing in accordance with programs stored in the ROM.

The CPU also executes various types of processing in accordance with programs loaded from the storage unit 213 to the RAM. Additionally, the RAM appropriately store data necessary for various types of processing executed by the CPU.

The input unit 211 including a keyboard, a mouse, a touch panel and soon is connected to the control unit 201. The output unit 212 including displays such as a CRT (Cathode Ray Tube) display and an LCD (Liquid Crystal Display) as well as a speaker and the like is connected to the control unit 201. The storage unit 213 including a SSD (Solid State Drive) such as a flash memory, a hard disc and so on is also connected to the control unit 201. The communication unit 214 including interfaces of a wired LAN (Local Area Network) or a wireless LAN, a modem and so on is further connected to the control unit 201. The communication unit 214 performs communication processing through networks including Internet.

The drive 215 is further connected to the control unit 201 according to need, and removable media 221 such as a magnetic disc, an optical disc, a magneto-optical disc and a semiconductor memory are appropriately mounted on the drive 215. A computer program read from the removable media 221 through the drive 215 is installed in the storage unit 213 according to need.

The back-illuminated image sensor manufacturing unit 202 manufactures the back-illuminated CMOS image sensor in accordance with the control by the control unit 201. That is, the back-illuminated image sensor manufacturing unit 202 generates the condensing lens 111 to the passivation film 119 of the CMOS image sensor 100. The manufacturing method is optional. For example, the back-illuminated image sensor manufacturing unit 202 manufactures the back-illuminated CMOS image sensor by any of the same kind of methods in related art.

The front-illuminated image sensor manufacturing unit 203 manufactures the front-illuminated CMOS image sensor in accordance with the control by the control unit 201. The front-illuminated image sensor manufacturing unit 203 generates the wiring layer 120 to the support substrate 125 of the CMOS image sensor 100. The manufacturing method is optional. For example, the front-illuminated image sensor manufacturing unit 203 manufactures the front-illuminated CMOS image sensor by any of the same kind of methods in related art.

The assembly unit 204 assembles the CMOS image sensor 100 in accordance with the control by the control unit 201. That is, the assembly unit 204 connects the back-illuminated CMOS image sensor manufactured by the back-illuminated image sensor manufacturing unit 202 to the front-illuminated CMOS image sensor manufactured by the front-illuminated image sensor manufacturing unit 203. More specifically, the assembly unit 204 superimposes the front-illuminated CMOS image sensor on the surface side of the back-illuminated CMOS image sensor and connects respective pads by the TSV 131.

Flow of Manufacturing Method

Figure 4:
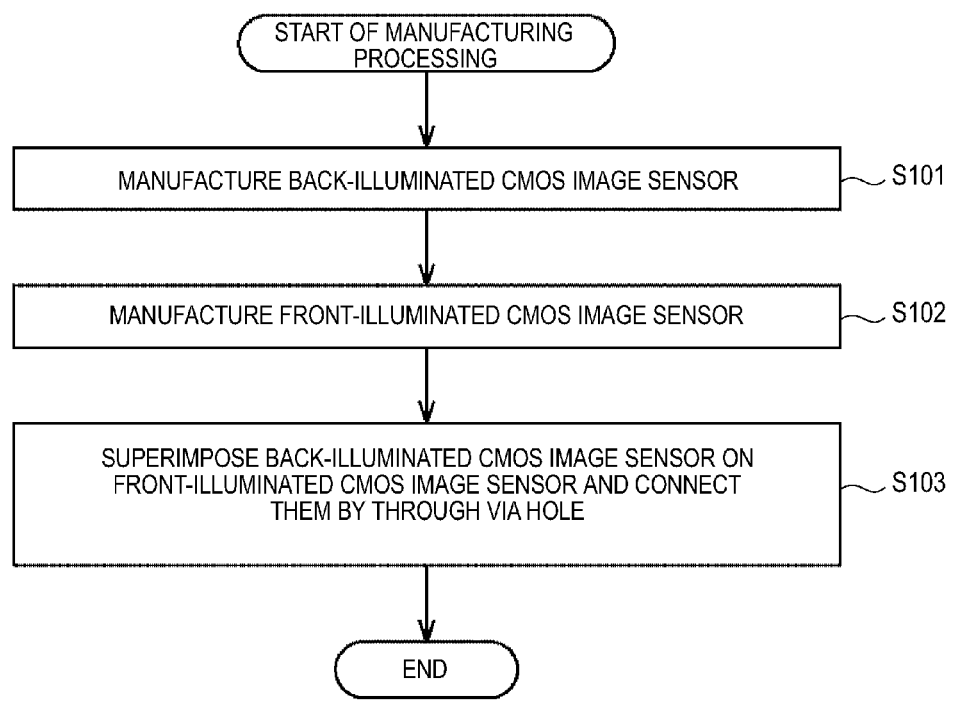
FIG. 4 is a flowchart for explaining an example of a flow of manufacturing processing.

An example of a flow of manufacturing processing will be explained with reference to a flowchart of FIG. 4.

When the manufacturing apparatus 200 manufactures the CMOS image sensor 100, the control unit 201 executes manufacturing processing.

When the manufacturing processing is started, the control unit 201 controls the back-illuminated image sensor manufacturing unit 202 to manufacture the back-illuminated CMOS image sensor in Step S101.

In Step S102, the control unit 201 controls the front-illuminated image sensor manufacturing unit 203 to manufacture the front-illuminated CMOS image sensor.

In Step S103, the control unit 201 controls the assembly unit 204 to assemble the CMOS image sensor 100. More specifically, the assembly unit 204 superimposes the front-illuminated CMOS image sensor manufactured by the processing of Step S102 on the surface side of the back-illuminated CMOS image sensor manufactured by the processing of Step S101 in accordance with the control by the control unit 201. Furthermore, the assemble unit 204 connects these pads by the through via hole (TSV) in accordance with the control by the control unit 201.

When the processing of Step S103 ends, the control unit 201 completes the manufacturing processing.

According to the manufacturing processing described above, the manufacturing apparatus 200 can manufacture the CMOS image sensor 100 more easily without using special processing and equipment such as ion implantation with ultra-high energy or laser annealing. That is, it is possible to more easily realize the imaging device capable of obtaining more various images more easily.

3. Third Embodiment

Imaging Device

It is preferable that the CMOS image sensor 100 is configured so that most of light transmitted through the photodiode 115 is transmitted through the wiring layer 116 and the wiring layer 120 (among respective wirings) and reaches the photodiodes 124. That is, positions of respective wirings 117 in the wiring layer 116 and positions of respective wirings 121 in the wiring layer 120 are optional as long as optical paths of incident light from the photodiodes 115 to the photodiodes 124 are secured. For example, the wirings 117 and the wirings 121 may be positioned below the photodiodes 115 or above the photodiodes 124.

Figure 5:
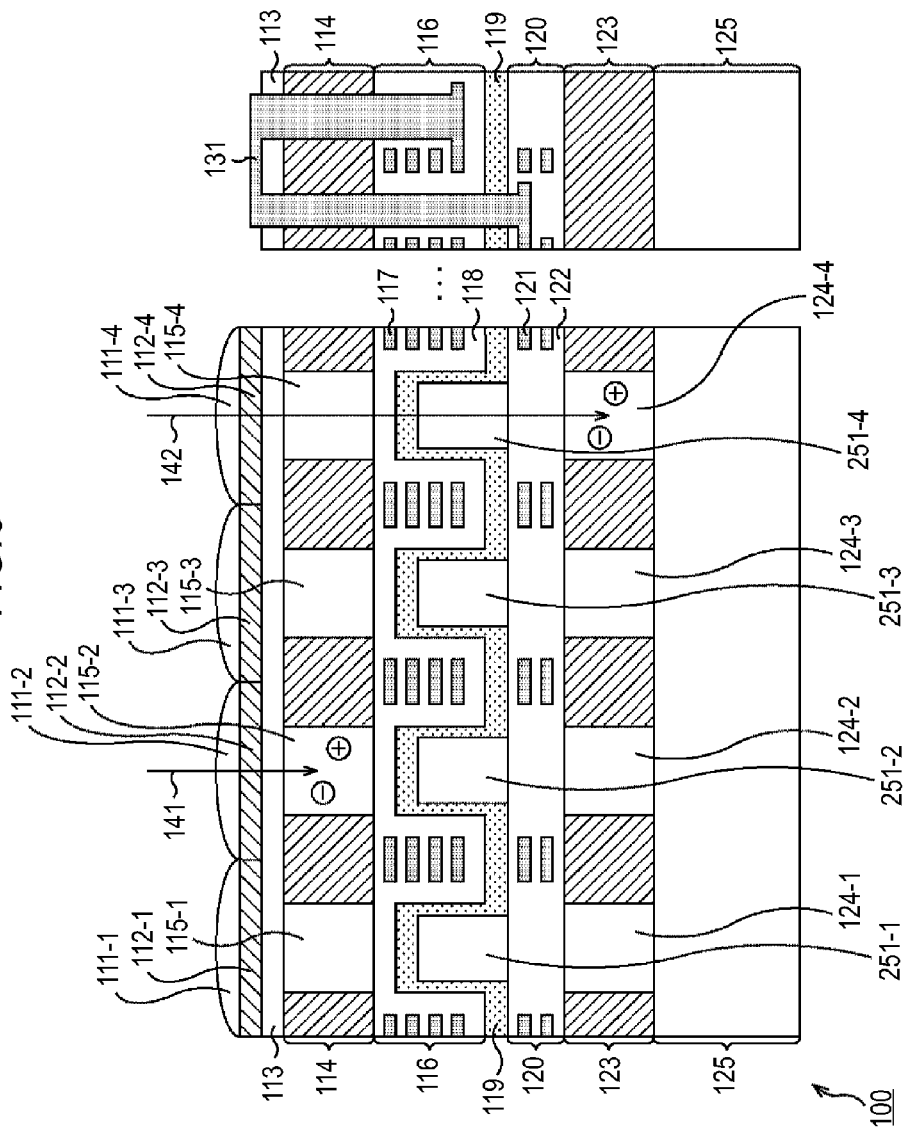
FIG. 5 is a view showing another structure example of a CMOS image sensor according to an embodiment of the present disclosure.

It is also preferable, for example, to form waveguides in the wiring layer 116. FIG. 5 is a view showing an example of a main structure of the CMOS image sensor 100 in this case. In the example shown in FIG. 5, a waveguide 251-1 is formed at a position approximately below the photodiode 115-1 in the wiring layer 116 of the CMOS image sensor 100. A waveguide 251-2 is formed at a position approximately below the photodiode 115-2 in the wiring layer 116. A waveguide 251-3 is formed at a position approximately below the photodiode 115-3 in the wiring layer 116. A waveguide 251-4 is formed at a position approximately below the photodiode 115-4 in the wiring layer 116. When it is not necessary to distinguish respective waveguides 251-1 to 251-4 from one another for explanation, each waveguide will be referred to as merely a waveguide 251.

The waveguides 251 are made of a given waveguide material including, for example, a material with a higher refractive index of light than surrounding materials. Other structures are the same as the case of FIG. 2.

The waveguides 251 are formed in forming of the back-illuminated CMOS image sensor. For example, first, holes are formed at positions approximately below the photodiodes 115 (between the wirings 117) in the wiring layer 116 from below to top in the drawing. Next, the passivation film 119 is formed on the surface side (a lower surface in the drawing) of the back-illuminated CMOS image sensor including the holes. Then, the waveguides 251 are formed in respective holes in the wiring layer 116.

As shown in FIG. 5, incident light transmitted through the photodiodes 115 reach the photodiodes 124 through the waveguides 251. Accordingly, the CMOS image sensor 100 can supply the near-infrared light 142 which is the wavelength band component of near-infrared light included in the incident light to the photodiodes 124 efficiently by waveguide effects of the waveguides 251 in this case. That is, the sensitivity of the photodiodes 124 can be improved.

The waveguides may be formed in the wiring layer 120. It is also preferable that the waveguides are formed both in the wiring layer 116 and the wiring layer 120. In both cases, the sensitivity of the photodiodes 124 can be improved as described above. Additionally, materials for the waveguides are optional.

The CMOS image sensor 100 explained in the present embodiment can be manufactured by the same method as explained in the second embodiment. That is, it is possible to form the above waveguides in the wiring layer 116 when the control unit 201 controls the back-illuminated image sensor manufacturing unit 202 to manufacture the back-illuminated CMOS image sensor (Step S101). The waveguides can be formed by any of the same kind of methods in related art.

In the case where the waveguides are provided in the wiring layer 120, it is possible to form the above waveguides in the wiring layer 120 when the control unit 201 controls the front-illuminated image sensor manufacturing unit 203 to manufacture the front-illuminated CMOS image sensor (Step S102). Also in this case, the waveguides can be formed by any of the same kind of methods in related art.

In the case where the waveguides are provided both in the wiring layer 116 and the wiring layer 120, it is possible to form the waveguides in respective wiring layers by controlling the back-illuminated image sensor manufacturing unit 202 and the front-illuminated image sensor manufacturing unit 203 by the control unit 201.

That is, the manufacturing apparatus 200 can manufacture the CMOS image sensor 100 more easily also in the present embodiment.

4. Fourth Embodiment

Imaging Device

Positions in the structure of respective pixels are not limited to the above example. For example, it is possible to perform positional correction (pupil correction) according to an incident angle of incident light and so on.

Generally, incident light incident on the imaging device is incident on pixels in the vicinity of the center at an approximately right angle, however, the incident light is incident on peripheral pixels at a given angle (incident angle θ) toward the central direction under the effect of, for example, lenses and so on.

In the case of the CMOS image sensor 100 in FIG. 2 or FIG. 5, optical paths are formed in the vertical direction in the drawing. That is, the optical paths are optimized with respect to incident light incident at an approximately right angle, however, the optical paths are not always optimum with respect to light incident at given angles, and a light condensing rate with respect to the photodiodes 115 or the photodiodes 124 may be reduced.

Figure 6:
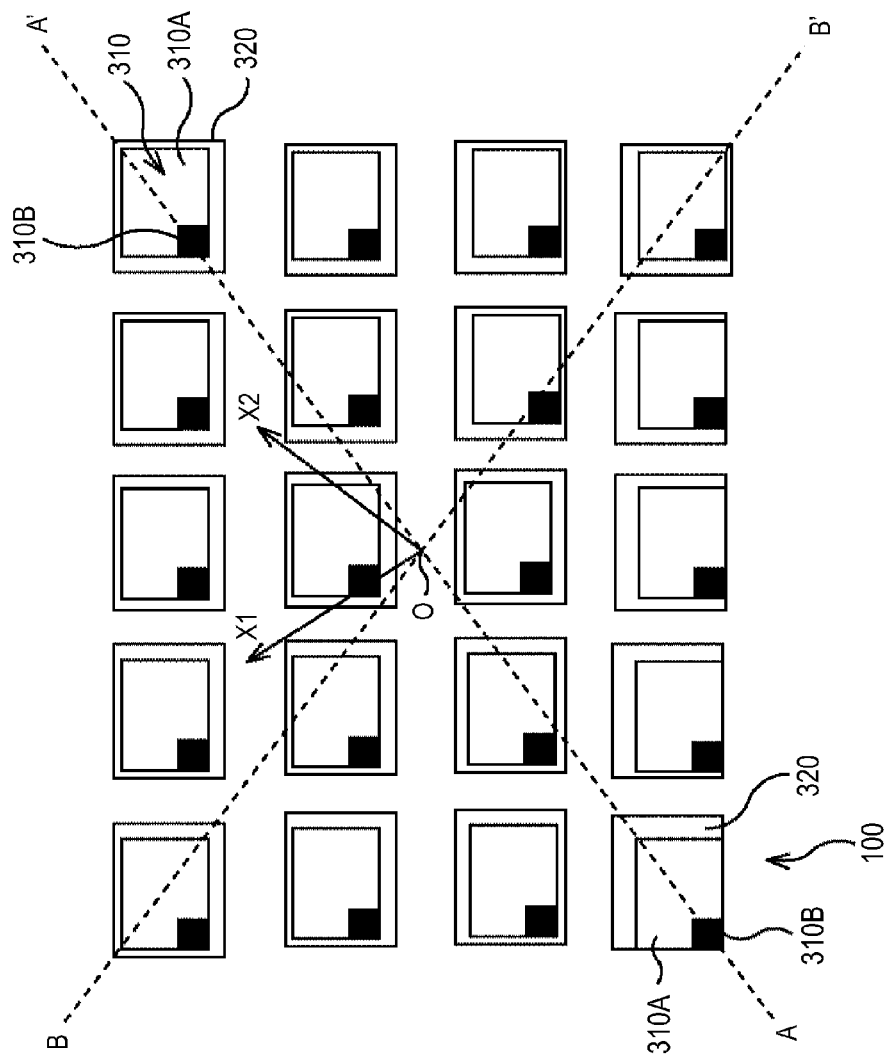
FIG. 6 is a diagram for explaining an example of pupil correction.

Accordingly, as shown in FIG. 6, positions in respective structures of respective pixels may be corrected according to the incident angle θ of the incident light (may be arranged at appropriate positions).

FIG. 6 is a diagram showing an appearance in outline of the CMOS image sensor seen from the side on which light is incident, in which structures of respective pixels are arranged in consideration of the incident angle θ of the incident light.

As shown in FIG. 6, a lens 320 which is a microlens of each pixel is provided toward the center with respect to a sensor light receiving unit 310A in accordance with the incident angle θ of incident light in each pixel 310 of the CMOS image sensor 100.

Figure 7:
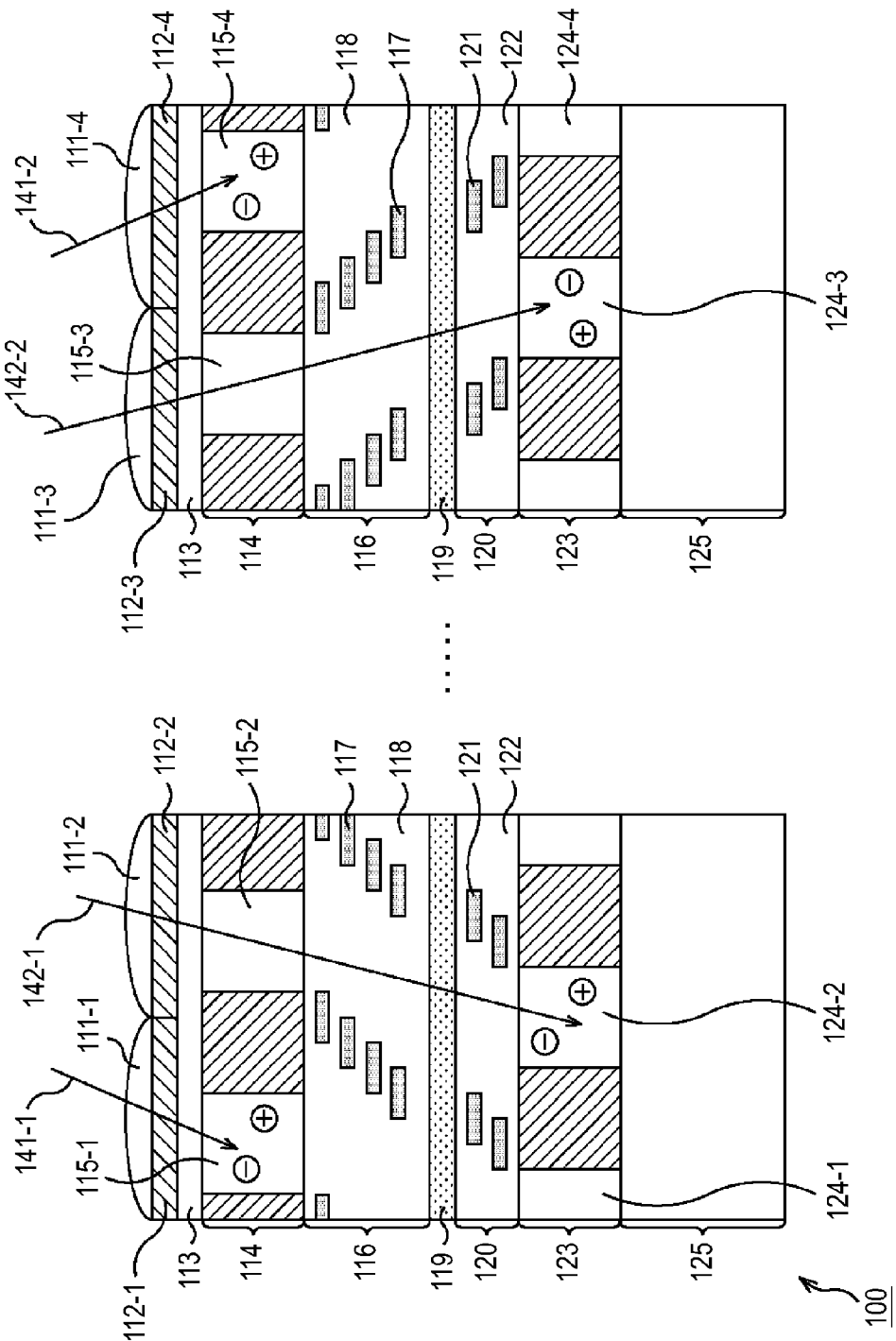
FIG. 7 is a view showing further another structure example of a CMOS image sensor according to an embodiment of the present disclosure.

FIG. 7 shows a cross section of the CMOS image sensor 100 in the above case similar to FIG. 2 and FIG. 5. As shown in FIG. 7, the condensing lenses 111 and the color filters 112 are arranged toward the center with respect to the photodiodes 115 in accordance with the incident angle θ in respective pixels. Actually, they are arranged toward the center in a two-dimensional arrangement as shown in FIG. 6.

According to the above arrangement, the optical paths from the condensing lens 111 to the photodiode 115 are inclined with respect to the vertical direction at angles in accordance with the incident angle θ. Accordingly, as the light paths are properly set with respect to the incident light in this case, it is possible to suppress the reduction in the light condensing rate of the photodiodes 115.

Note that respective layers of the wirings 117 are also arranged so as to be inclined in accordance with the incident angle θ of near-infrared light as the example shown in FIG. 7. That is, the wirings 117 are arranged outward from the photodiode 115 in accordance with the incident angle θ (a reverse direction of the center).

Furthermore, respective layers of the wirings 121 are arranged so as to be inclined in accordance with the incident angle θ of near-infrared light as the example shown in FIG. 7. That is, the wirings 121 are arranged further outward from the wirings 117 in accordance with the incident angle θ (the reverse direction of the center).

Moreover, the photodiodes 124 are arranged further outward from the wirings 121 in accordance with the incident angle θ (the reverse direction of the center) of near-infrared light as the example shown in FIG. 7.

According to the above arrangement, the optical paths from the photodiode 115 to the photodiode 124 are inclined with respect to the vertical direction at angles in accordance with the incident angle θ. Accordingly, as the light paths are properly set with respect to the incident light in this case, it is possible to suppress the reduction in the light condensing rate of the photodiodes 124.

The CMOS image sensor 100 explained in the present embodiment can be also manufactured by the same method as explained in the second embodiment. That is, it is possible to arrange respective layers so that the above-described pupil correction is performed when the control unit 201 controls both the back-illuminated image sensor manufacturing unit 202 and the front-illuminated image sensor manufacturing unit 203 to manufacture respective CMOS image sensors (Step S101 and Step S102).

That is, the manufacturing apparatus 200 can manufacture the CMOS image sensor 100 more easily also in the present embodiment.

5. Fifth Embodiment

Imaging Device

Figure 8:
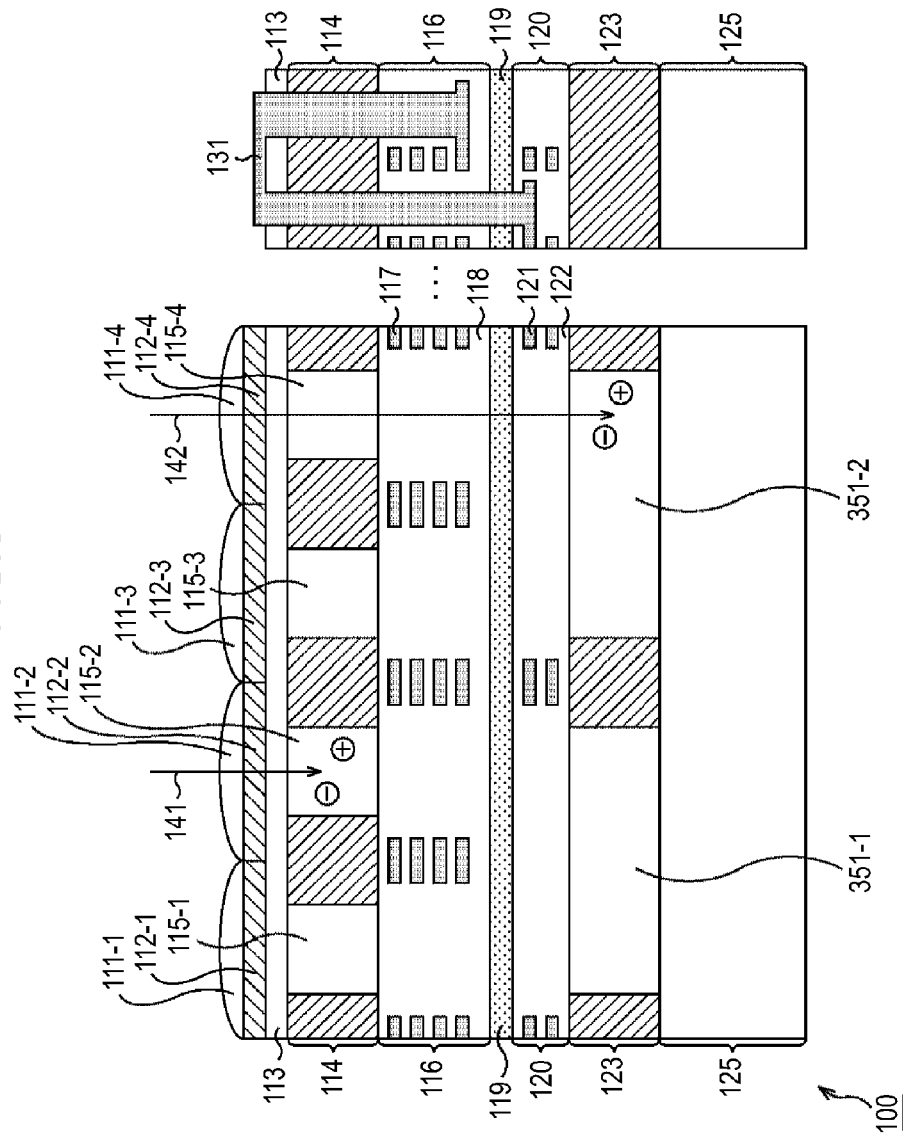
FIG. 8 is a view showing further another structure example of a CMOS image sensor according to an embodiment of the present disclosure.

The size, shape and intervals of photodiodes are optional, and at least one of them may be different to each other between the photodiode 115 and the photodiode 124 as in an example shown in FIG. 8.

In the example of FIG. 8, a photodiode 351-1 and a photodiode 351-2 each having the size of two photodiodes 115 are formed in the semiconductor substrate 123. That is, the photodiode 351-1 is formed below the photodiode 115-1 and the photodiode 115-2 in the semiconductor substrate 123, which corresponds to the photodiode 115-1 and the photodiode 115-2. That is, the photodiode 351-1 performs photoelectric conversion of the wavelength band component of near-infrared light in incident light transmitted through the photodiode 115-1 or the photodiode 115-2.

On the other hand, the photodiode 351-2 is formed below the photodiode 115-3 and the photodiode 115-4 in the semiconductor substrate 123, which corresponds to the photodiode 115-3 and the photodiode 115-4. That is, the photodiode 351-2 performs photoelectric conversion of the wavelength band component of near-infrared light in incident light transmitted through the photodiode 115-3 or the photodiode 115-4. When it is not necessary to distinguish the photodiode 351-1 and the photodiode 351-2 from each other for explanation, each photodiode will be referred to as merely a photodiode 351.

In such case, wiring intervals of the wirings 117 in the wiring layer 116 may be different from wiring intervals of the wirings 121 in the wiring layer 120. In the example of FIG. 8, the wirings 117 are formed below portions other than the photodiodes 115 of the semiconductor substrate 114 so as to correspond to arrangement intervals of the photodiodes 115. On the other hand, the wirings 121 are formed above portions other than the photodiodes 351 in the semiconductor substrate 123 so as to correspond to arrangement intervals of the photodiodes 351.

The arrangement intervals of the wirings 117 and the wirings 121 are not limited to the example of FIG. 8 and are optional. For example, arrangement positions of the wirings 117 may be above portions other than the photodiodes 351 in the semiconductor substrate 123 so as to correspond to the wirings 121. Also, arrangement positions of the wirings 121 may be below portions other than the photodiodes 115 in the semiconductor substrate 114 so as to correspond to the wirings 117.

According to the above structure, the CMOS image sensor 100 sets resolutions in the visible light image and in the near-infrared light image independently from each other. For example, the CMOS image sensor 100 can obtain the visible light image and the near-infrared light image having different resolutions from each other.

Though the size of the photodiodes in the horizontal direction of the drawing is different according to the layer in the example of FIG. 8, the embodiment is not limited to the example, and at least one of the size, shape and intervals of photodiodes in respective layers may be different in respective layers.

The CMOS image sensor 100 explained in the present embodiment can be manufactured by the same method as explained in the second embodiment. That is, as the back-illuminated image sensor manufacturing unit 202 and the front-illuminated image sensor manufacturing unit 203 manufacture the CMOS image sensors independently from each other, the size, shape and intervals of the photodiodes can be set independently from each other.

That is, the manufacturing apparatus 200 can manufacture the CMOS image sensor 100 more easily also in the present embodiment.

6. Sixth Embodiment

Imaging Device

As explained above, images of visible light and near-infrared light can be obtained, however, the thickness of respective photodiodes is optional. That is, the wavelength band photoelectrically converted in respective photodiodes is optional, therefore, the CMOS image sensor 100 can obtain an image in an optional wavelength band by setting the depth of the potential distribution of respective photodiodes in accordance with the penetration length of incident light to silicon.

Figure 9:
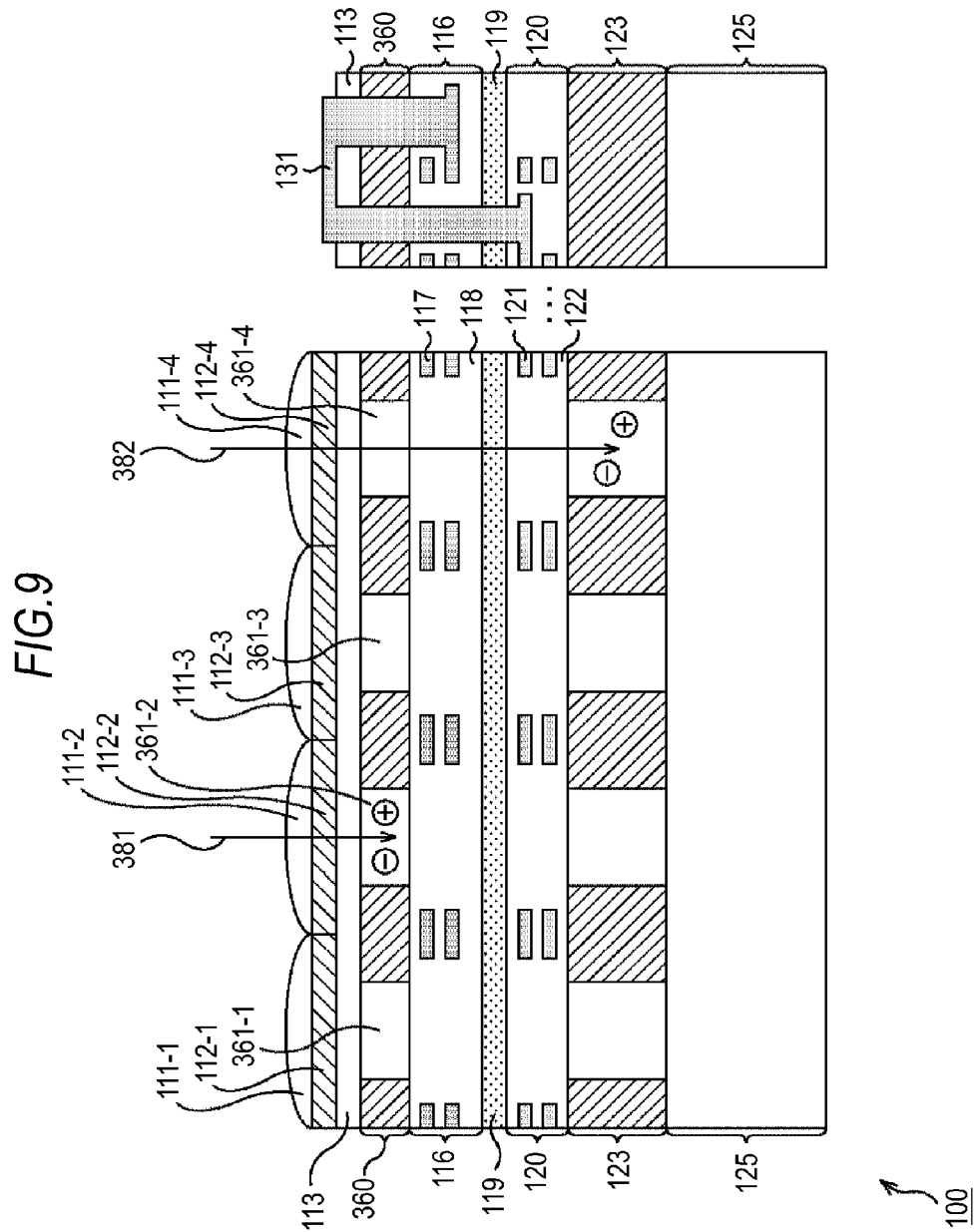
FIG. 9 is a view showing further another structure example of a CMOS image sensor according to an embodiment of the present disclosure.

For example, as in an example shown in FIG. 9, it is preferable that the CMOS image sensor 100 obtains two visible light images having different wavelength bands from each other. In the example of FIG. 9, a semiconductor substrate 360 is formed instead of the semiconductor substrate 114 of FIG. 2. In the semiconductor substrate 360, photodiodes 361-1 to 361-4 are formed. That is, the photodiodes 361-1 to 361-4 respectively correspond to the photodiodes 115-1 to 115-4. When it is not necessary to distinguish respective photodiodes 361-1 to 361-4 from one another for explanation, each photodiode will be referred to as merely a photodiode 361. Other structures are the same as FIG. 2.

The semiconductor substrate 360 is formed to be thinner than the semiconductor substrate 114 of FIG. 2 (for example, 1 µm). According to the structure, the photodiode 361 can perform photoelectric conversion of a short-wavelength band component of visible light (a visible light 381) included in incident light. As the photodiode 361 is formed to be thinner, the depth of the photodiode 124 becomes shallower. Accordingly, the photodiode 124 can photoelectrically convert a long-wavelength band component of visible light (a visible light 382) included in incident light, not near-infrared light. For example, the CMOS image sensor 100 can also form images in photodiodes in different layers according to the color.

As described above, the CMOS image sensor 100 includes plural layers of photodiodes, performing photoelectric conversion in respective photodiodes. Accordingly, wavelength band components to be photoelectrically converted in respective layers of photodiodes may be respectively set. As described above, the thickness of respective photodiodes is optional, therefore, the thickness can be set in respective layers independently from each other. For example, it is possible to set the thickness of photodiodes to be different according to the layer and it is also possible to unify the thickness of photodiodes in all layers. That is, the setting of the wavelength band component to be photoelectrically converted in respective photodiodes can be performed more easily as well as more freely.

As described above, the CMOS image sensor 100 can control not only the wavelength band component photoelectrically converted by the photodiodes 361 but also the wavelength band component photoelectrically converted by the photodiodes 124 according to the thickness of the photodiodes 361.

The CMOS image sensor 100 explained in the present embodiment can be manufactured by the same method as explained in the second embodiment. That is, as the back-illuminated image sensor manufacturing unit 202 and the front-illuminated image sensor manufacturing unit 203 manufacture the CMOS image sensors independently from each other, the thickness of layers of photodiodes can be set independently from each other.

That is, the manufacturing apparatus 200 can manufacture the CMOS image sensor 100 more easily also in the present embodiment.

7. Seventh Embodiment

Imaging Device

Figure 10:
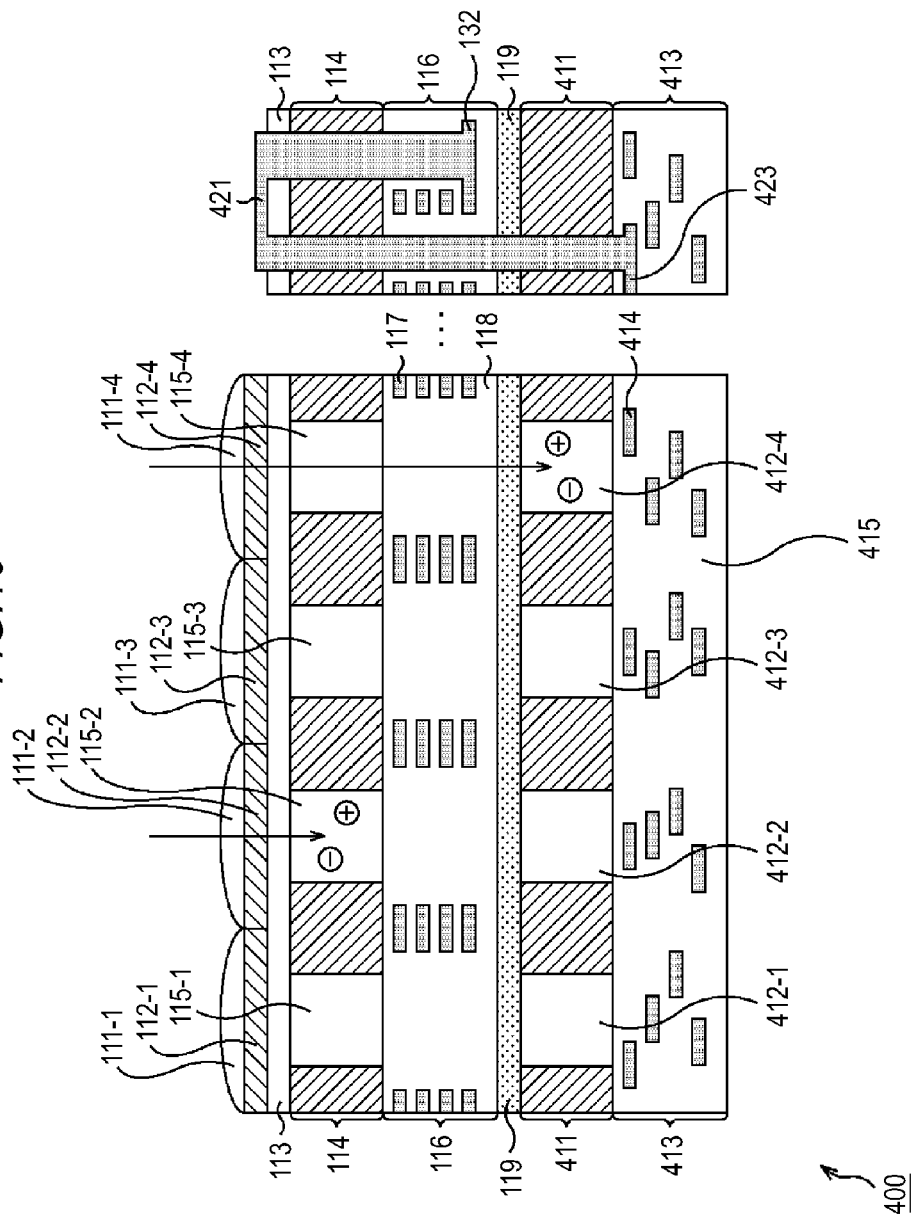
FIG. 10 is a view showing further another structure example of a CMOS image sensor according to an embodiment of the present disclosure.

As explained above, the front-illuminated CMOS image sensor is superimposed on the surface side of the back-illuminated CMOS image sensor, however, the embodiment is not limited to this, and for example, it is also preferable that the back-illuminated CMOS image sensor is superimposed instead of the front-illuminated CMOS image sensor as shown in FIG. 10.

A CMOS image sensor 400 shown in FIG. 10 includes the condensing lens 111 to the passivation film 119 in the same manner as the above CMOS image sensor 100. The CMOS image sensor 400 includes a semiconductor substrate 411 and a wiring layer 413 instead of the wiring layer 120 to the support substrate 125.

In the semiconductor substrate 411, photodiodes 412-1 to 412-4 are formed so as to correspond to pixels of the photodiodes 115-1 to 115-4. When it is not necessary to distinguish respective photodiodes 412-1 to 412-4 from one another for explanation, each photodiode will be referred to as merely a photodiode 412.

The photodiodes 412 perform photoelectric conversion of a wavelength band component different from the photodiodes 115 in the same manner as the photodiodes 124. More specifically, the photodiode 412 performs photoelectric conversion of a wavelength band longer than the photodiodes 115. For example, the photodiodes 115 perform photoelectric conversion of the wavelength band component of visible light, whereas the photodiodes 412 perform photoelectric conversion of the wavelength band component of near-infrared light. Or, for example, the photodiodes 115 perform photoelectric conversion of the short-wavelength band component of visible light, whereas the photodiodes 412 perform photoelectric conversion of the long-wavelength band component of visible light.

In the case of the CMOS image sensor 400, the wiring layer 413 is formed below the semiconductor substrate 411 in the drawing. That is, the CMOS image sensor 400 is configured so that the back-illuminated CMOS image sensor is formed on the surface side of the back-illuminated CMOS image sensor.

The wiring layer 413 has wirings 414 in the optional number of layers and a wiring interlayer film 415 basically in the same manner as the above wiring layer 116 and the wiring layer 120. As the wiring layer 413 is positioned below the photodiodes 412, it is not necessary to provide light paths. Therefore, it is possible to arrange the wirings 414 at optional positions. That is, the wirings 414 can be laid out more easily.

A pad 423 is provided at an area other than the effective pixel area of the wiring layer 413 as an external terminal in the same manner as the cases of the wiring layer 116 and the wiring layer 120. The pad 423 is connected to the pad 132 of the wiring layer 116 by a TSV 421.

As described above, the CMOS image sensor 400 can obtain more various images more easily in the same manner as the CMOS image sensor 100.

In the case of the CMOS image sensor 400, incident light can reach the photodiode (photodiode 412) on a deep side not through the wiring layer 413. Therefore, the CMOS image sensor 400 can improve sensitivity of the photodiodes 412 more than the case where the front-illuminated CMOS image sensor is superimposed as the CMOS image sensor 100.

The CMOS image sensor 400 explained in the present embodiment can be manufactured basically by the same method as explained in the second embodiment. However, in this case, the control unit 201 controls the back-illuminated image sensor manufacturing unit 202 instead of controlling the front-illuminated image sensor manufacturing unit 203 in the processing of Step S102 to manufacture the back-illuminated CMOS image sensor. The back illuminated CMOS image sensor can be also manufactured by any of the same kind of methods in related art in the same manner as in the case of Step S101. Other processing can be performed in the same manner as explained in the second embodiment.

That is, the manufacturing apparatus 200 can manufacture the CMOS image sensor 400 more easily also in the present embodiment.

As described above, there is not great difference in the manufacturing methods of the CMOS image sensors explained in respective embodiments. Accordingly, the manufacturing apparatus 200 can easily perform switching of manufacturing methods among the above respective types of manufacturing methods without preparing a special device anew or providing a special process anew. That is, the manufacturing apparatus 200 can manufacture more various types of CMOS image sensor more easily.

The case where the present disclosure is applied to the CMOS image sensor has been explained above, and the present disclosure can be applied to any kind of image sensors as long as image sensors use photoelectric conversion devices such as photodiodes, not limited to the CMOS image sensor. For example, the present disclosure can be applied to a CCD (Charge Coupled Device) image sensor.

The case where two layers of photodiodes sandwiching the wiring layer are included has been explained above, but the photodiodes may be provided in three layers or more. That is, it is also preferable that three or more layers of photodiodes are formed so as to sandwich wiring layers between respective layers. In other words, it is also preferable that three or more back-illuminated or front-illuminated CMOS image sensors are stacked and that respective pads are connected by through via holes.

Also when forming three or more layers of photodiodes, respective layers of photodiodes can obtain images in wavelength bands different from one another. That is, the CMOS image sensor in this case can obtain three or more images in wavelength bands different from one another. As a result, the CMOS image sensor can obtain more various images more easily.

Charge accumulation time of respective layers of photodiodes can be set independently from one another. That is, the photodiodes of respective layers can be easily driven so that the charge accumulation time differs from one another. Therefore, for example, it is possible to set the charge accumulation time of photodiodes in one layer to be longer than the charge accumulation time of photodiodes in another layer. Accordingly, the CMOS image sensor can obtain images having a higher dynamic range than images obtained by photodiodes of one layer by obtaining plural images with different charge accumulation times and combining these images with each other.

As described above, the CMOS image sensor 400 can perform photoelectric conversion of wavelength band components in incident light different from each other in respective layers of photodiodes.

8. Eighth Embodiment

Imaging Apparatus

Figure 11:
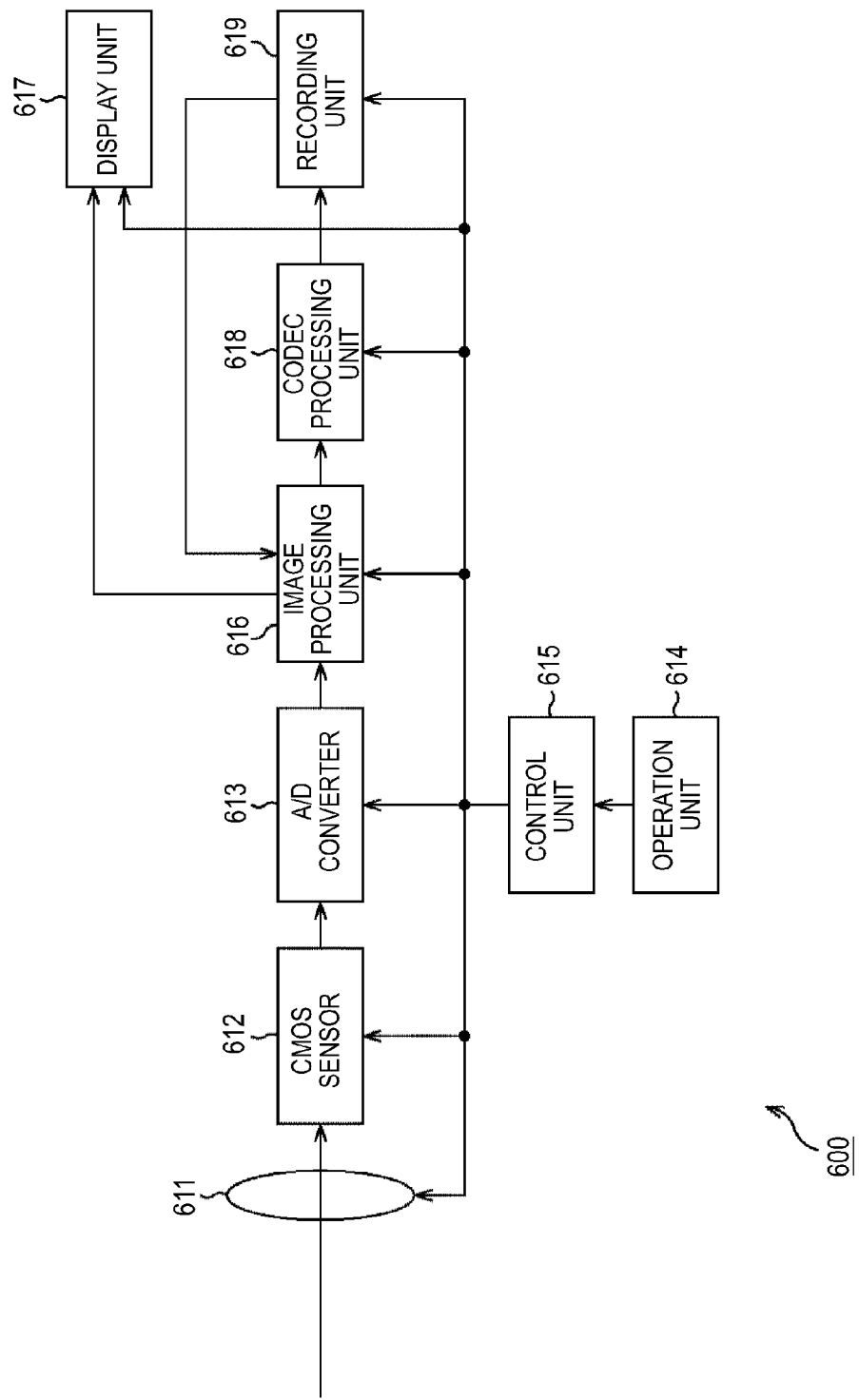
FIG. 11 is a block diagram showing an example of a main configuration of an imaging apparatus.

FIG. 11 is a diagram showing a configuration example of an imaging apparatus to which the present disclosure is applied. An imaging apparatus 600 shown in FIG. 11 is an apparatus imaging a subject and outputting an image of the subject as electric signals.

As shown in FIG. 11, the imaging apparatus 600 includes a lens unit 611, a CMOS sensor 612, an A/D converter 613, an operation unit 614, a control unit 615, an image processing unit 616, a display unit 617, a codec processing unit 618 and a recording unit 619.

The lens unit 611 adjusts a focal point to the subject and condenses light from a position where the focal point is adjusted to supply the light to the CMOS sensor 612.

The CMOS sensor 612 is a solid-state imaging device having the structure explained above, in which pixels for detecting color mixture are provided in the effective pixel area.

The A/D converter 613 converts voltage signals of respective pixels supplied from the CMOS sensor 612 at given timings into digital pixel signals (hereinafter appropriately referred to as pixel signals) and sequentially supplies the signals to the image processing unit 616 at given timings.

The operation unit 614 includes, for example, a jog dial (trademark), keys, buttons or a touch panel, receiving an operation input by a user and supplying a signal corresponding to the operation input to the control unit 615.

The control unit 615 controls driving of the lens unit 611, the CMOS sensor 612, the A/D converter 613, image processing unit 616, the display unit 617, the codec processing unit 618 and the recording unit 619 based on the signal corresponding to the operation input by the user inputted by the operation unit 614 to allow respective units to perform processing concerning the imaging.

The image processing unit 616 performs various types of image processing such as the color mixture correction, black level correction, white balance adjustment, demosaic processing, matrix processing, gamma correction and YC conversion with respect to image signals supplied from the A/D converter 613. The image processing unit 616 supplies the image signals to which image processing is performed to the display unit 617 and the codec processing unit 618.

The display unit 617 is configured as, for example, a liquid crystal display and so on, displaying subject images based on the pixel signals from the image processing unit 616.

The codec processing unit 618 performs coding processing in a given system to the image signals from the image processing unit 616, supplying image data obtained as a result of the coding processing to the recording unit 619.

The recording unit 619 records the image data from the codec processing unit 618. When the image data recorded in the storage unit 619 is read to the image processing unit 616 according to need, the image data is supplied to the display unit 617 and a corresponding image is displayed.

The imaging apparatus including the solid-state imaging device and the image processing unit to which the present disclosure is applied is not limited to the above configuration and other configurations can be used.

Naturally, the respective devices explained above can include structures other than the above-described structures. Each device can be configured not only as one device but also as a system including plural devices.

When the above series of processing is executed by software, programs included in the software are installed from networks or recording media.

The recording media are configured by the removable media 221 (FIG. 3), separately from the apparatus itself, in which programs are recorded, which are distributed for delivering programs to the user. The removable media 221 includes magnetic discs (including a flexible disc) and optical discs (including a CD-ROM of a DVD). The removable media 221 also includes magneto-optical discs (including a MD (Mini Disc)), a semiconductor memory and so on. The removable media can be also configured by a ROM of the control unit 201 (FIG. 3) in which programs are recorded or a hard disc included in the storage unit 213 (FIG. 3), which is distributed to the user in a state of being built in the apparatus itself in advance.

A program executed by a computer may be a program processed in time series along the order explained in the specification and may be a program processed in parallel or at a necessary timing such as when calling is performed.

Additionally, steps describing the program recorded in the recording media include not only processing performed in time series along the described order but also processing executed in parallel or individually, though not always processed in time series.

In the present specification, a system represents the whole apparatus including plural devices.

In the above description, a structure explained as one device (or a processing unit) may include plural devices (or processing units). Conversely, a structure explained as plural devices (or processing units) may be integrally configured as one device (or a processing unit). It is also possible to add structures other than the above structures to respective devices (or respective processing units). Furthermore, part of a structure of a certain device (or a processing unit) is included in a structure of another device (or another processing unit) as long as structures and operations are substantially the same as the whole system. That is, the embodiments of the present disclosure are not limited to the above embodiments and can be variously altered within a scope not departing from the gist of the present disclosure.

The present disclosure may be implemented as the following configurations.

(1) An imaging device including
plural photoelectric conversion device layers in which photoelectric conversion devices performing photoelectric conversion of incident light are formed, and
a wiring layer sandwiched by respective photoelectric conversion device layers, in which wirings for reading charges from the photoelectric conversion devices are formed.

(2) The imaging device described in the above (1),
in which the photoelectric conversion devices perform photoelectric conversion of wavelength band components of incident light different from each other in respective photoelectric conversion device layers.

(3) The imaging device described in the above (2),
in which photoelectric conversion devices in the first layer counted from the light incident side perform photoelectric conversion of a wavelength band component of visible light and photoelectric conversion devices in the second layer counted from the light incident side perform photoelectric conversion of a wavelength band component of near-infrared light in the plural photoelectric conversion device layers.

(4) The imaging device described in the above (2),
in which photoelectric conversion devices in the first layer counted from the light incident side perform photoelectric conversion of a short-wavelength band component of visible light and photoelectric conversion devices in the second layer counted from the light incident side perform photoelectric conversion of a long-wavelength band component of visible light in the plural photoelectric conversion device layers.

(5) The imaging device described in any one of the above (2) to (4),
in which the thickness of the photoelectric conversion devices differs from each other in respective layers.

(6) The imaging device described in any one of the above (1) to (5),
   in which at least one of the size, shape and intervals of the photoelectric conversion devices differs in respective layers.
(7) The imaging device described in any one of the above (1) to (6),
   in which photoelectric conversion devices in plural layers output charges accumulated by photoelectrically converting incident light at the same timing.
(8) The imaging device described in any one of the above (1) to (7),
   in which photoelectric conversion devices in plural layers output charges accumulated by photoelectrically converting incident light at different timings in respective layers.
(9) The imaging device described in any one of the above (1) to (8),
   in which photoelectric conversion devices in plural layers output a combined image formed by combining images in respective layers by outputting charges accumulated by photoelectrically converting incident light.
(10) The imaging device described in any one of the above (1) to (9),
   in which charge accumulation time of photoelectric conversion devices during which charges are accumulated by photoelectrically converting incident light differs in respective layers.
(11) The imaging device described in any one of the above (1) to (10),
   in which the wirings in the wiring layer are arranged so that optical paths of incident light transmitted from one side to the other side of the wiring layer are secured.
(12) The imaging device described in the above (11),
   in which waveguides made of a material with a higher refractive index of light than surrounding materials are formed in the wiring layer.
(13) The imaging device described in the above (11) or (12),
   in which the wirings in the wiring layer are arranged in accordance with an incident angle of the incident light.
(14) The imaging device described in any on of the above (1) to (13),
   in which external terminals of plural wiring layers in which wirings for reading charges from photoelectric conversion devices indifferent layers are formed are connected to each other by a through via hole.
(15) An imaging device including plural imaging devices superimposed to each other, each having a photoelectric conversion device layer in which photoelectric conversion devices performing photoelectric conversion of incident light are formed, and a wiring layer in which wirings for reading charges from the photoelectric conversion devices are formed, in which circuits of respective imaging devices are connected to each other.
(16) The imaging device described in the above (15),
   in which plural back-illuminated imaging devices are superimposed, in which each wiring layer is formed on a side opposite to the light incident side of each photoelectric conversion device layer.
(17) The imaging device described in the above (15),
   in which a back-illuminated imaging device in which the wiring layer is formed on the side opposite to the light incident side of the photoelectric conversion device layer and a front-illuminated imaging device in which the wiring layer is formed on the light incident side of the photoelectric conversion device layer are superimposed.
(18) An imaging apparatus including
an imaging device having plural photoelectric conversion device layers in which photoelectric conversion devices performing photoelectric conversion of incident light are formed, and a wiring layer sandwiched by respective photoelectric conversion device layers, in which wirings for reading charges from the photoelectric conversion devices are formed, which images a subject, and
a control unit controlling drive of the imaging device to perform imaging for obtaining a subject image.
(19) A manufacturing apparatus including
imaging device manufacturing units manufacturing plural imaging devices each having a photoelectric conversion device layer in which photoelectric conversion devices performing photoelectric conversion of incident light are formed, and
a wiring layer in which wirings for reading charges from the photoelectric conversion devices are formed, and
an assembly unit superimposing the plural imaging devices manufactured by the imaging device manufacturing units and connecting circuits of respective imaging devices to each other.
(20) A manufacturing method of a manufacturing apparatus, including
manufacturing plural imaging devices each having a photoelectric conversion device layer in which photoelectric conversion devices performing photoelectric conversion of incident light are formed, and
a wiring layer in which wirings for reading charges from the photoelectric conversion devices are formed by imaging device manufacturing units, and
superimposing the manufactured plural imaging devices and connecting circuits of respective imaging devices to each other by an assembly unit.

The present disclosure contains subject matter related to that disclosed in Japanese Priority Patent Application JP 2011-193823 filed in the Japan Patent Office on Sep. 6, 2011, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:
1. An imaging device comprising:
a plurality photoelectric conversion device layers, including at least first and second photoelectric conversion device layers in which photoelectric conversion devices performing photoelectric conversion of incident light are formed; and
a plurality of wiring layers, including at least first and second wiring layers sandwiched by respective photoelectric conversion device layers, in which wirings for reading charges from the photoelectric conversion devices are formed, wherein the first wiring, layer is formed on a side opposite to a light incident side of the first photoelectric conversion device layer, and wherein the second wiring layer is formed on a light incident side of the second photoelectric conversion device layer.
2. The imaging device according to claim 1,
wherein the photoelectric conversion devices perform photoelectric conversion of wavelength band components of incident light different from each other in respective photoelectric conversion device layers.

3. The imaging device according to claim 2,
wherein photoelectric conversion devices in a first layer counted from a light incident side perform photoelectric conversion of a wavelength band component of visible light and photoelectric conversion devices in a second layer counted from the light incident side perform photoelectric conversion of a wavelength band component of near-infrared light in the plurality of photoelectric conversion device layers.

4. The imaging device according to claim 2,
wherein photoelectric conversion devices in a first layer counted from a light incident side perform photoelectric conversion of a short-wavelength band component of visible light and photoelectric conversion devices in a second layer counted from the light incident side perform photoelectric conversion of a long-wavelength band component of visible light in the plurality of photoelectric conversion device layers.

5. The imaging device according to claim 2,
wherein the thickness of at least some of the photoelectric conversion devices layers differ from each other.

6. The imaging device according to claim 1,
wherein at least one of a size, shape and intervals of the photoelectric conversion devices differs in different layers.

7. The imaging device according to claim 1,
wherein photoelectric conversion devices in plural layers output charges accumulated by photoelectrically converting incident light at the same timing.

8. The imaging device according to claim 1,
wherein photoelectric conversion devices in different ones of the photoelectric conversion device layers output charges accumulated by photoelectrically converting incident light at different times in respective layers.

9. The imaging device according to claim 1,
wherein photoelectric conversion devices in the plurality of photoelectric conversion device layers output a combined image formed by combining images in respective layers by outputting charges accumulated by photoelectrically converting incident light.

10. The imaging device according to claim 1,
wherein charge accumulation time of photoelectric conversion devices during which charges are accumulated by photoelectrically converting incident light differs in different layers.

11. The imaging device according to claim 1,
wherein the wirings in the plurality of wiring layers are arranged so that optical paths of incident light transmitted from one side to another side of the wiring layer are secured.

12. The imaging device according to claim 11,
wherein waveguides made of a material with a higher refractive index of light than surrounding materials are formed in the wiring layers.

13. The imaging device according to claim 11,
wherein the wirings in the wiring layers are arranged in accordance with an incident angle of the incident light.

14. The imaging device according to claim 1,
wherein external terminals of plural wiring layers in which wirings for reading charges from photoelectric conversion devices in different layers are formed are connected to each other by a through via hole.

15. The imaging device of claim 1, wherein the first photoelectric conversion device layer is part of a back-illuminated photoelectric conversion device, and wherein the second photoelectric conversion device layer is part of a front-illuminated photoelectric conversion device.

16. The imaging device of claim 15, wherein the first and second photoelectric conversion device layers are superimposed.

17. An imaging device comprising:
a plurality of imaging devices superimposed with one another, each having a photoelectric conversion device layer in which photoelectric conversion devices for performing photoelectric conversion of incident light are formed, and a wiring layer in which wirings for reading charges from the photoelectric conversion devices are formed,
wherein circuits of respective imaging devices are connected to each other; and wherein a back-illuminated imaging device in which the wiring layer is formed on a side opposite to a light incident side of the photoelectric conversion device layer and a front-illuminated imaging device in which the wiring layer is formed on a light incident side of the photoelectric conversion device layer are superimposed.

18. An imaging apparatus comprising:
an imaging device having a plurality of photoelectric conversion device layers, including at least first and second photoelectric conversion device layers in which photoelectric conversion devices performing photoelectric conversion of incident light are formed, and a plurality of wiring layers including at least first and second wiring layers sandwiched by the first and second, photoelectric conversion device layers, in which wirings for reading charges from the photoelectric conversion devices are formed, which images a subject, wherein the first wiring layer is formed on a side opposite to a light incident side of the first photoelectric conversion device layer, and wherein the second wiring layer is formed on a light incident side of the second photoelectric conversion device layer; and
a control unit controlling drive of the imaging device to perform imaging for obtaining a subject image.

* * * * *

UNITED STATES PATENT AND TRADEMARK OFFICE
CERTIFICATE OF CORRECTION

PATENT NO. : 9,294,691 B2
APPLICATION NO. : 13/597328
DATED : March 22, 2016
INVENTOR(S) : Susumu Ooki It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 698 days.

Signed and Sealed this
Fourteenth Day of June, 2016

Michelle K. Lee
*Director of the United States Patent and Trademark Office*